United States Patent [19]

Kawakami et al.

[11] Patent Number: 5,210,940
[45] Date of Patent: May 18, 1993

[54] METHOD OF PRODUCING A PRINTED CIRCUIT BOARD

[75] Inventors: Shin Kawakami; Hirotaka Okonogi; Junichi Ichikawa, all of Saitama, Japan

[73] Assignee: Nippon CMK Corp., Japan

[21] Appl. No.: 734,253

[22] Filed: Jul. 22, 1991

[30] Foreign Application Priority Data

Jul. 24, 1990 [JP] Japan ............................ 2-195704

[51] Int. Cl.⁵ .......................................... H01K 3/10
[52] U.S. Cl. .................................... 29/852; 174/262; 427/97; 430/319
[58] Field of Search ............... 430/319; 29/852; 156/902; 427/97; 174/262, 263

[56] References Cited

U.S. PATENT DOCUMENTS

| | | | |
|---|---|---|---|
| 3,742,597 | 7/1973 | Davis | 174/263 X |
| 4,487,659 | 12/1984 | Coppin | 29/852 X |
| 4,512,829 | 4/1985 | Ohta et al. | 29/852 X |
| 4,528,259 | 7/1985 | Sullivan | 430/319 X |
| 4,529,477 | 7/1985 | Lundberg et al. | 427/97 X |
| 4,720,324 | 1/1988 | Hayward | 29/852 X |
| 4,861,640 | 8/1989 | Gurol | 29/852 X |
| 4,996,391 | 2/1991 | Schmidt | 29/852 X |
| 5,129,142 | 7/1992 | Bindra et al. | 174/263 X |

OTHER PUBLICATIONS

IBM Tech. Discl. Bull. vol. 12, No. 8, Jan. 1970, pp. 1272-1273 by M. M. Haddad et al.

*Primary Examiner*—Carl J. Arbes
*Attorney, Agent, or Firm*—Bruce L. Adams; Van C. Wilks

[57] ABSTRACT

A method of manufacturing a printed circuit board comprises providing an insulating substrate having opposed major sides, forming a through-hole between the two sides of the insulating substrate, forming a conductive land on both sides of the insulating substrate surrounding the ends of the through-hole, forming margining frames at the outer peripheries of the conductive lands, and packing conductive paste into the through-hole after the formation of the margining frames. The margining frames extend vertically beyond the height of the conductive lands and prevent the conductive paste from spreading outwardly beyond the outer peripheries of the conductive lands.

9 Claims, 1 Drawing Sheet

METHOD OF PRODUCING A PRINTED CIRCUIT BOARD

BACKGROUND OF THE INVENTION

The present invention relates to a method of producing a printed circuit board having through-holes.

In a conventional method of forming a conducting path between the two sides of a printed circuit board having circuit patterns formed on one or both sides of an insulating substrate, as shown in FIG. 2, such work has been carried out by penetrating a through-hole 4 between lands 2 and 3 of the circuit patterns formed on the insulating substrate 1 and then packing conductive paste 5 into the through-hole 4 by silk-screen printing or the like.

When forming the circuit patterns with a copper-film-cladded laminated board, the through-hole 4 is usually bored by punching or drilling prior to forming the circuit patterns, and then solder resist 6 is adhered after forming the circuit patterns by etching.

When packing conductive paste 5 into the through-hole 4 in the manufacture of a conventional printed circuit board, it is also necessary to build up conductive paste 5 on the lands 2 and 3 to secure an electrical connection.

However, while the paste 5 is usually packed by using a printing means such as silk-screen printing, this technique has a drawback in that the paste spreads or sticks on the outer periphery of the narrow lands 2 and 3. This has been a serious problem, because it often generates defects owing to bridge formation between adjoining lands and may also deteriorate the electrical insulation between lands, as high-density printed circuit patterns become practical.

SUMMARY OF THE INVENTION

An object of the present invention is to eliminate the above disadvantage of the conventional printed circuit board and to solve the above problems.

Another object of the present invention is to provide a method of manufacturing a printed circuit board capable of packing conductive paste into a through-hole without deteriorating the electrical insulation between lands.

According to the present invention, there is provided a method of manufacturing a printed circuit board which comprises providing an insulating substrate for the printed circuit board, forming a through-hole between the two sides of the insulating substrate, forming circuit patterns on one or both sides of the insulating substrate, forming margining frames on the outer peripheries of both ends of the through-hole, and packing conductive paste into the through-hole after the formation of the margining frames.

According to the above construction of the printed circuit board, it is possible to prevent the conductive paste from oozing or adhering to undesirable portions of the circuit patterns and also to achieve required electrical insulation between the lands.

These objects and other objects, features, aspects, and advantages of the present invention will become more apparent from the following detailed description of the present invention when taken in conjunction with the accompanying drawings.

DETAILED EXPLANATION OF THE PREFERRED EMBODIMENT

Figure 1:
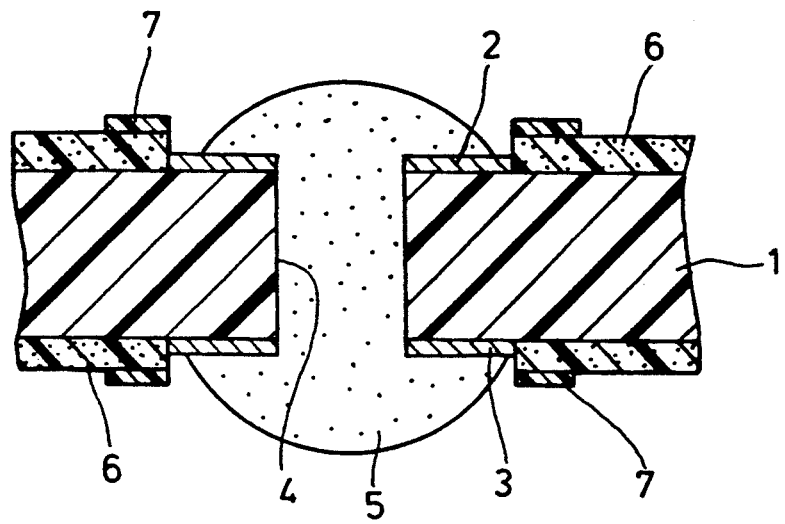
FIG. 1 is an illustration showing a method of manufacturing a printed circuit board of an embodiment of the present invention.
Figure 2:
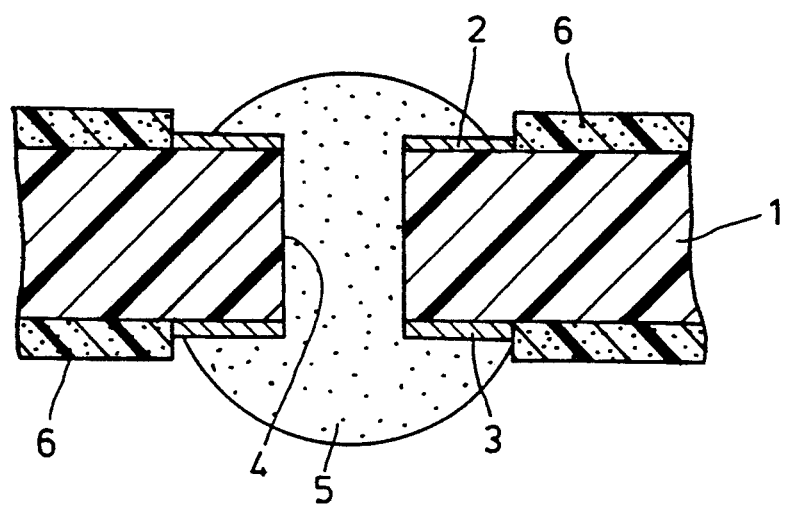
FIG. 2 is an illustration showing a conventional method of manufacturing a printed circuit board.

FIG. 1 is an illustration showing a method of manufacturing a printed circuit board according to one embodiment of the present invention.

Referring to FIG. 1, an insulating substrate 1 is made of a laminated plate cladded on both major surfaces or sides with copper film of approximately 25 $\mu$m in thickness. Prescribed circuit patterns (not shown) are formed on the two sides.

Prior to forming the circuit patterns, a through-hole 4 is formed by boring, specifically punching or drilling, at the location where the two sides of the insulating substrate 1 are to be made conductive.

After the circuit patterns are formed, solder resist 6 is adhered to both sides of the insulating substrate 1 by means of silk-screen printing, but is not adhered to lands 2 and 3 of the through-hole 4 or other electrical junction lands (not shown) such as lands for parts insertion.

At the time of, or subsequent to, the adhering of the solder resist 6, annular margining frames 7 are each formed along the outer peripheries of the lands 2 and 3 by means of silk-screen printing or the like using the same solder resist ink or other insulating ink.

Then, conductive paste 5 is packed into the through-hole 4 by means of silk-screen printing to provide an electrical connection between the lands 2 and 3 through the conductive paste 5.

The margining frames 7 serve to prevent outward oozing or sticking of paste 5 beyond the outer peripheries of the lands 2 and 3, which could otherwise occur when packing conductive paste 5 into the through-hole 4.

The above prevention can be most effectively accomplished by providing frames 7 whose layer thickness is 20 $\mu$m or more greater than that of the copper film forming the lands 2 and 3.

In addition, the frames 7 play a useful role in protecting the lands 2 and 3 from undergoing exterior damage, such as scratches and dents in subsequent work processes.

What is claimed is:

1. A method of manufacturing a printed circuit board, comprising: providing an insulative substrate having two opposed major surfaces; forming a through-hole in the substrate between the two major surfaces; forming two conductive lands, one on each major surface of the substrate, surrounding the opposite ends of the through-hole; filling the through-hole with conductive paste and spreading the conductive paste over the two conductive lands to provide an electrically conductive path between the two major surfaces of the substrate; and preventing outward spreading of the conductive paste beyond the outer peripheries of the conductive lands by forming a layer of solder resist around the outer periphery of the conductive land on each major surface of the substrate, and forming annular frames of insulative material, one on each of the respective solder resist layer, around the outer peripheries of the conductive lands before the spreading of the conductive paste.

2. A method according to claim 1; wherein the annular frames have a thickness at least 20 μm greater than that of the conductive lands.

3. A method according to claim 2; wherein the forming of the annular frames comprises forming the annular frames by silk-screen printing.

4. A method according to claim 3; wherein the insulative material of the annular frames comprises insulating ink.

5. A method according to claim 1; wherein the forming of the annular frames comprises forming the annular frames by silk-screen printing.

6. A method according to claim 5; wherein the insulative material of the annular frames comprises insulating ink.

7. A method according to claim 1; wherein the conductive lands are formed of copper.

8. A method according to claim 7; wherein the annular frames have a thickness at least 20 μm greater than that of the conductive lands.

9. A method according to claim 1; wherein the annular frames extend outwardly from the insulative substrate a greater distance than the conductive lands.

* * * * *